(12) United States Patent
Masmanidis et al.

(10) Patent No.: US 8,044,556 B2
(45) Date of Patent: Oct. 25, 2011

(54) HIGHLY EFFICIENT, CHARGE DEPLETION-MEDIATED, VOLTAGE-TUNABLE ACTUATION EFFICIENCY AND RESONANCE FREQUENCY OF PIEZOELECTRIC SEMICONDUCTOR NANOELECTROMECHANICAL SYSTEMS RESONATORS

(75) Inventors: Sotirios Konstantinos Masmanidis, Pasadena, CA (US); Rassul Bulatovich Karabalin, North Hills, CA (US); Michael L. Roukes, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1096 days.

(21) Appl. No.: 11/830,653

(22) Filed: Jul. 30, 2007

(65) Prior Publication Data
US 2011/0001392 A1    Jan. 6, 2011

Related U.S. Application Data

(60) Provisional application No. 60/834,054, filed on Jul. 28, 2006.

(51) Int. Cl.
H01L 41/04 (2006.01)
(52) U.S. Cl. .................................................. 310/330
(58) Field of Classification Search ............ 310/317, 310/330–332
See application file for complete search history.

(56) References Cited

U.S. PATENT DOCUMENTS
3,185,935 A    5/1965   White

2002/0172820 A1*  11/2002  Majumdar et al. ............ 428/357
2003/0123124 A1    7/2003  Abu-Ageel
2004/0212277 A1*  10/2004  Stommer ..................... 310/320

OTHER PUBLICATIONS

Blom, F. R., et al., Thin-film ZnO as micromechanical actuator at low frequencies, Sens Actuators A Phys; Sensors and Actuators, A: Physical 2 PT2 1990, Jun. 25, 1989, pp. 226-228, XP008086350, vol. 21, No. 1-3.
Elwenspoek, M. et al., Transduction mechanisms and their applications in micromechanical devices, IEEE Micro Electro Mechanical Systems, Feb. 20, 1989, pp. 126-132, XP010092263, New York, NJ, USA.
Strittmatter, R. P., et al., GaN Schottky diodes for piezoelectric strain sensing, Journal of Applied Physics, American Institute of Physics, May 1, 2003, pp. 5675-5681, XP012059587, ISSN: 0021-8979, vol. 93, No. 9.
Knoll, et al., Micron-sized mechanical oscillators created by 3D two-photon polymerization: Towards a mechanical logic device, Microelectronic Engineering, Apr. 2006, pp. 1261-1264, XP005426810, ISSN: 0167-9317, vol. 83, No. 4-9, Elsevier Publishers BV, Amsterdam, NL.

(Continued)

Primary Examiner — Derek Rosenau
(74) Attorney, Agent, or Firm — Gates & Cooper LLP

(57) ABSTRACT

A nanoelectromechanical systems (NEMS) device and method for using the device provide for a movable member that includes a region of low conductivity over which an electric field is developed. A region width is within a factor of ten (10) of a thickness of the NEMS device. The region is formed between a junction that incorporates piezoelectric material. A first voltage is applied across the region which alters a width of an active portion of the region thereby adjusting a movement of the movable member induced by a second voltage. The second voltage is applied across the region to produce a strain on the active portion of the region. The strain results in a defined movement of the movable member.

18 Claims, 12 Drawing Sheets

OTHER PUBLICATIONS

Bargatin, I, et al., Database Inspec [Online], The Institution of Electrical Engineers, Stevenage, GB; Mar. 28, 2005, Bargatin I et al: Sensitive detection of nanomechanical motion using piezoresistive signal downmixing, XP002460547, Database accession No. 8361005, & Applied Physics Letters AIP USA, Mar. 28, 2005, p. 133109-1, ISSN: 0003-6951, vol. 86, No. 13.

Armantrout, Robert J., An IF module for wide-bandwidth signals—HP 70910A test device—Product Information—Technical, Hewlett-Packard Journal, [Online] Nov. 1995, pp. 1-11, XP002460546, Retrieved from the Internet: URL:http://findarticles.com/p/articles/mi_mOHPJ/is_n5_v46/ai_17496582/print>[retrieved on Nov. 29, 2007].

I. Bargatin et al., Efficient electrothermal actuation of multiple modes of high-frequency nanoelectromechanical resonators, Applied Physics Letters, (2007), 093116-1, 093116-2, 093116-3, vol. 90.

R. G. Beck et al., Strain-sensing cryogenic field-effect transistor for integrated strain detection in GaAs/AlGaAs microelectromechanical systems, Appl. Phys. Lett., Jun. 24, 1996, pp. 3763-3765, vol. 68, Issue No. (26).

D. W. Carr et al., Fabrication of nanoelectromechanical systems in single crystal silicon using silicon on insultor substrates and electron beam lithography, J. Vac. Sci. Technol. B, Nov./Dec. 1997, pp. 2760-2763, vol. 15, Issue No. (6).

A. N. Cleland et al., Noise processes in nanomechanical resonators, Journal of Applied Physics, Sep. 1, 2002, pp. 2758-2769, vol. 92, Issue No. 5.

A. N. Cleland et al., A nanometre-scale mechanical electrometer, Nature, Mar. 12, 1998, pp. 160-162, vol. 392, Nature Macmillan Publishers Ltd.

H. G. Craighead, Nanoelectromechanical Systems, Science, Nov. 24, 2000, pp. 1532-1535, vol. 290.

M. J. Curie, Developpement par compression de l'electicite polaire dans les cristaux hemiedres a faces inclinees, Bulletin de la Societe mineralogique de France, (1880), pp. 90-93.

Don L. Devoe, Piezoelectric thin film micromechanical beam resonators, Sensors and Actuators A, (2001), pp. 263-272, vol. 88.

K. L. Ekinci et al., Electromechanical Transducers at the Nanoscale: Actuation and Sensing of Motion in Nanoelectromechanical Systems (NEMS), Small, (2005), pp. 786-797, vol. 1, Issue No. 8-9.

W. Chung Fon et al., Nanoscale, Phonon-Coupled Calorimetry with Sub-Attojoule/Kelvin Resolution, Nano Letters, (2005), pp. 1968-1971, vol. 5, Issue No. 10.

K. Fricke, Piezoelectric properties of GaAs for application in stress transducers, J. Appl. Phys., Jul. 15, 1991, pp. 914-918, vol. 70, Issue No. (2).

J. Fritz et al., Translating Biomolecular Recognition into Nanomechanics, Science, Apr. 14, 2000, pp. 316-318, vol. 288.

A. Husain et al., Nanowire-based very-high-frequency electromechanical resonator, Applied Physics Letters, Aug. 11, 2003, pp. 1240-1242, vol. 83, Issue No. 6.

Seong Chan Jun et al., Electrothermal tuning of Al-SiC nanomechanical resonators, Nanotechnology, (2006), pp. 1506-1511, vol. 17, Institute of Physics Publishing.

R. Knobel et al., Piezoelectric displacement sensing with a single-electron transistor, Applied Physics Letters, Sep. 16, 2002, pp. 2258-2260, vol. 81, Issue No. 12.

M. D. Lahaye et al., Approaching the Quantum Limit of a Nanomechanical Resonator, Science, Apr. 2, 2004, pp. 74-77, vol. 304.

Mark C. Lonergan et al., Array-Based Vapor Sensing using Chemically Sensitive, Carbon Black-Polymer Resistors, Chem. Mater, 1996, pp. 2298-2312, vol. 8.

Constanze Hohberger Metzger et al., Cavity cooling of a microlever, Nature, Dec. 23-30, 2004, pp. 1002-1005, vol. 432, Nature Publishing Group.

Brett Piekarski et al., Surface micromachined piezoelectric resonant beam filters, Sensors and Actuators A, (2001), pp. 313-320, vol. 91.

M. L. Roukes et al., Mechanical Computation, Redux?, Electron Devices Meeting, Dec. 13-15, 2004, pp. 539-542, IEDM Technical Digest, IEEE International.

Thomas Rueckes et al., Carbon Nanotube-Based Nonvolatile Random Access Memory for Molecular Computing, Science, Jul. 7, 2000, pp. 94-97, vol. 289.

D. Rugar et al., Mechanical Parametric Amplification and Termomechanical Noise Squeezing, Physical Review Letters, Aug. 5, 1991, pp. 699-702, vol. 67, Issue No. 6.

Jan Soderkvist, Similarities between piezoelectric, thermal and other internal means of exciting vibrations, J. Micromech. Microeng., (1993), pp. 24-31, vol. 3.

Y. T. Yang et al., Zeptogram-Scale Nanomechanical Mass Sensing, Nano Letters, Mar. 15, 2006, pp. A-D, vol. 0, Issue No. 0 and vol. 6, p. 583 et seq.

Yong Zhang, Sensitivity of a piezoelectric micromechanical displacement detector based on the radio-frequency single-electron transistor, Journal of Applied Physics, Dec. 15, 2002, pp. 7550-7555, vol. 92, Issue No. 12.

\* cited by examiner

FIG. 4D
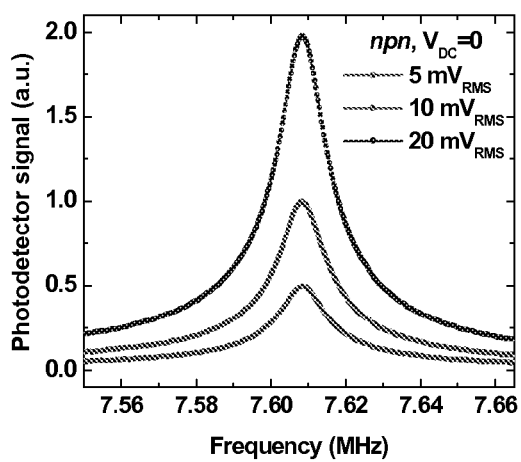
FIG. 4E
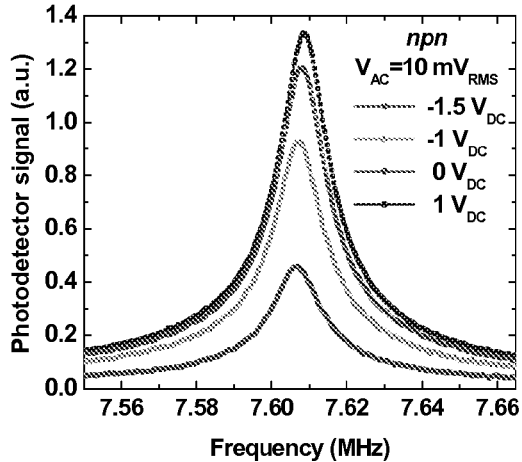
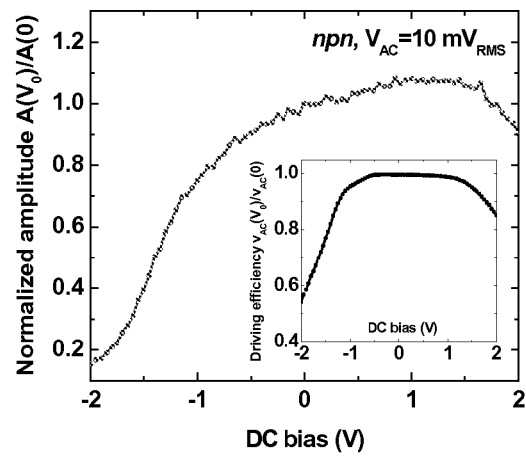
FIG. 4F

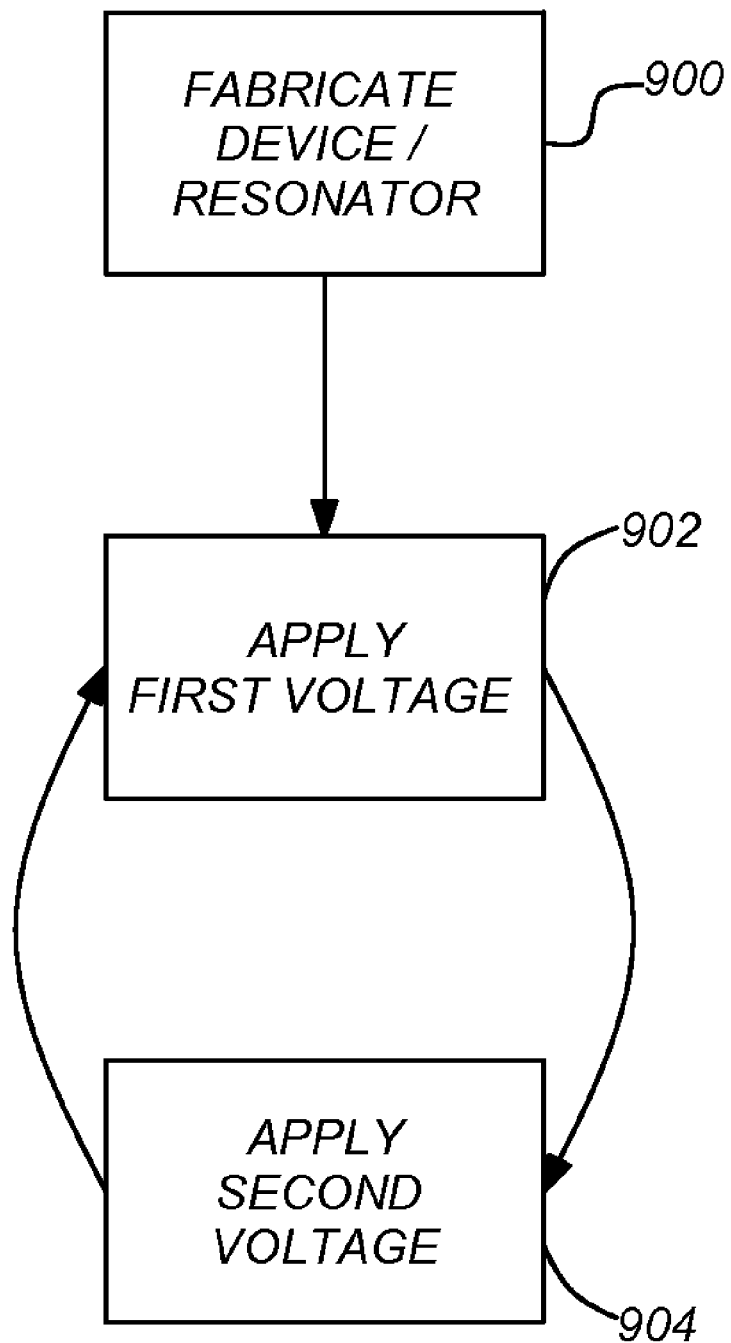

US 8,044,556 B2

HIGHLY EFFICIENT, CHARGE DEPLETION-MEDIATED, VOLTAGE-TUNABLE ACTUATION EFFICIENCY AND RESONANCE FREQUENCY OF PIEZOELECTRIC SEMICONDUCTOR NANOELECTROMECHANICAL SYSTEMS RESONATORS

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 60/834,054, filed on Jul. 28, 2006, by Sotirios K. Masmanidis, Rassul Karabalin, and Michael L. Roukes, entitled "D-NEMS: Highly efficient, charge depletion-mediated, voltage-tunable actuation efficiency and resonance frequency of piezoelectric semiconductor nanoelectromechanical systems resonators ".

STATEMENT REGARDING FEDERALLY SPONSORED RESEARCH AND DEVELOPMENT

The invention was made with Government support under Grant No. DAAD19-01-1-0541 awarded by ARO—US Army Robert Acquisition Center. The Government has certain rights in this invention.

BACKGROUND OF THE INVENTION

1. Field of the Invention

The present invention relates generally to semiconductors, and in particular, to a method, apparatus, and device that provides tunable nanoscale electromechanical coupling in piezoelectric semiconductors.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

The nanometer scale domain presents new opportunities for realizing electromechanical transducers with ultralow power consumption, high sensitivity, integrated large scale array architecture, and coupling to mesoscopic phenomena [1]. As an advancement of MEMS, which have become mainstream devices such as optical switches, ink jets, and accelerometers, nanoelectromechanical systems (NEMS) have shown great promise as highly sensitive detectors of mass [2, 3], displacement [4], charge [5], and energy [6]. However, as devices are scaled down, transduction becomes increasingly difficult, hampering efforts to create finely-controlled integrated systems.

In spite of significant progress in the field [7] an efficient, integrated, and customizable technique for actively driving and tuning NEMS resonators remains elusive. Conventional approaches like magnetomotive, electrostatic and electrothermal techniques [7, 8] suffer from either low power efficiency, limited potential for integration, or poor nanoscale control over electromechanical coupling. In contrast, one of the earliest and most straightforward actuation methods, which relies on the piezoelectric effect, provides a means of directly converting electric field into mechanical strain. Discovered by the Curie brothers in 1880 [9], it has since found widespread application in a multitude of systems ranging from clocks, to microwave electromechanical filters, and biosensors. However, new nanoscale functionality enabled by piezoelectric coupling has not yet been systematically explored with top-down NEMS devices.

SUMMARY OF THE INVENTION

Efficient actuation is crucial to obtaining optimal performance from nanoelectromechanical systems (NEMS). One or more embodiments of the invention employ epitaxial piezoelectric semiconductors to obtain efficient and fully integrated NEMS actuation, which is based upon exploitation of the interaction between piezoelectric strain and built-in charge depletion. The underlying actuation mechanism in these depletion-mediated NEMS becomes significant only for devices with dimensions approaching semiconductor depletion lengths. The induced actuation forces are controlled electrically, and resonant excitation approaching single-electron efficiency is demonstrated. The fundamental electromechanical coupling itself can be programmed by heterostructure band engineering, externally-controllable charge depletion, and crystallographic orientation. These attributes are combined to realize a prototype, mechanically-based XOR logic element.

BRIEF DESCRIPTION OF THE DRAWINGS

Referring now to the drawings in which like reference numbers represent corresponding parts throughout:

FIGS. 4D-F illustrate measured mechanical properties of piezoelectric actuation of a nanomechanical npn junction in accordance with one or more embodiments of the invention;

FIG. 9 illustrates the logical flow for utilizing/actuating a nanoelectromechanical (NEM) resonator in accordance with one or more embodiments of the invention.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Nanoscale electromechanical coupling in piezoelectric semiconductors is mediated by charge depletion and intrinsic material properties.

Detailed Description

One or more embodiments of the invention investigate the use of piezoelectric semiconductors as active structural materials for NEMS resonators (also referred to herein as nanomechanical devices). In this regard, embodiments may be implemented as a resonator/actuator but can include any other type of NEMS device that contains a movable member as set forth in further detail herein.

PIN Diode Embodiment

The active region of the nanomechanical devices consists of a 200 nm thick epitaxially grown GaAs p-type/intrinsic/n-type (pin) diode. Note that pin diode junctions may be used due to their high electrical resistance, which is required for efficient actuation, and convenience in modeling voltage-dependent charge depletion effects.

The clamped ends of the suspended structures lie on top of a sacrificial $Al_{0.8}Ga_{0.2}As$ layer, which is doped along with the substrate in order to allow the back side of the wafer to be used as a ground electrode. An n-doped layer serves as the top electrode, and finally the charge-depleted high resistance region in the middle forms the piezoelectrically active layer. Details on the pin junction doping profile and device fabrication are described in detail below.

Figure 1A:
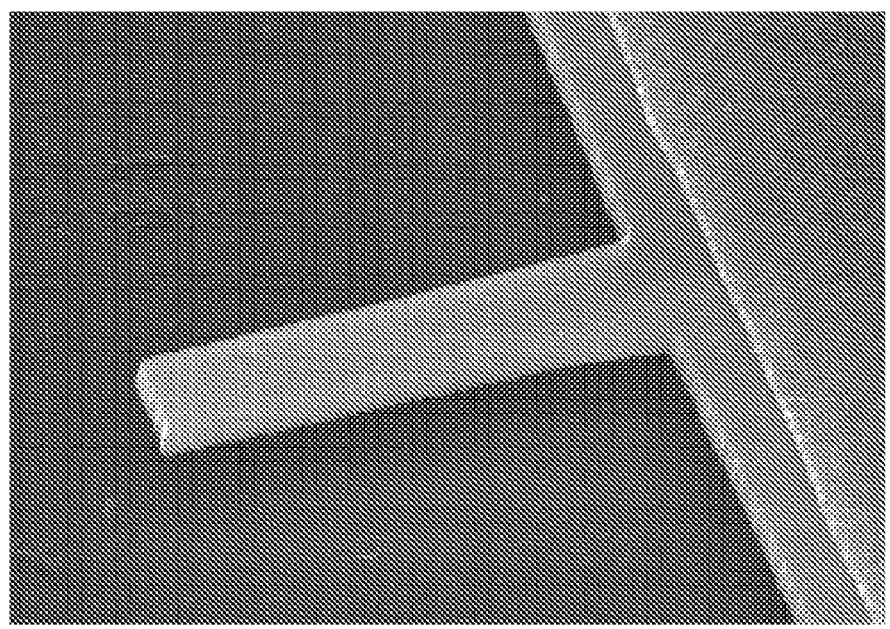
FIG. 1 illustrates nanomechanical piezoelectric actuation in accordance with one or more embodiments of the invention.
Figure 1B:
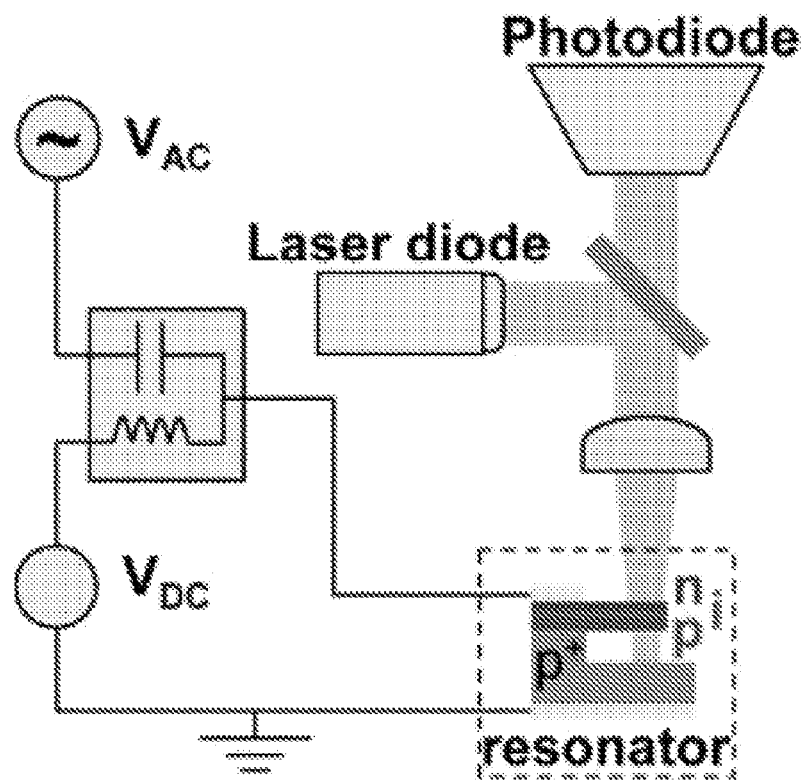
Figure 1C:
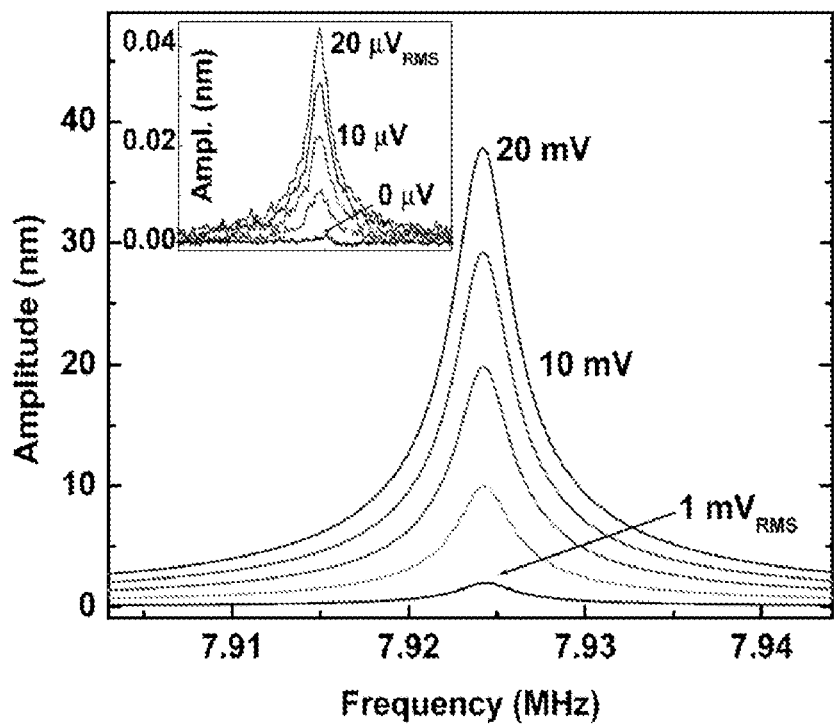

A NEMS device may be used to gauge the efficiency of piezoelectric excitation. In this regard, FIG. 1 illustrates nanomechanical piezoelectric actuation in accordance with one or more embodiments of the invention. FIG. 1A illustrates a GaAs cantilever with embedded pin diode structure. The dimensions are L, w, t=4, 0.8, 0.2 μm. Scale bar:1 μm. FIG. 1B illustrates a measurement setup. The bias-T allows both dc and ac signals to be applied. All measurements are performed at room temperature and a pressure of 5 mTorr. FIG. 1C illustrates frequency response around the resonance of a diode-embedded cantilever (pin-1) under zero dc bias. Each line corresponds to different amplitude ac driving signals across the diode junction. The inset shows the response to drive signals of a few microvolts (each line, in order of increasing amplitude, corresponds to the addition of 5 μV). The black line labeled '0 μV' corresponds to thermomechanical noise at 10 Hz bandwidth, and sets a lower limit on the ac driving signal that is required to generate an observable response.

As illustrated in FIG. 1A, the NEMS device may comprise a cantilever as depicted. To ensure that the mechanical readout scheme is decoupled from charge depletion effects, optical interferometry [12] may be used to sense motion so that no unnecessary complication is introduced into the analysis. During a typical measurement (e.g., using a measurement setup as illustrated in FIG. 1B), an ac signal applied across the pin junction actuates the device at or near its resonance frequency, while the addition of dc voltage tunes the depletion region width. Within the device, a transverse electric field produces a longitudinal strain $e_j=d_{3j}E_z$, where $d_{3j}$ is the anisotropic piezoelectric coefficient [13].

A bending moment develops when the strain is asymmetrically distributed around the beam's neutral axis, which results in mechanical resonance under a suitable range of driving frequencies. The particular cantilever shown in FIG. 1A is found to have a resonance frequency of 8 MHz and quality factor (Q) of 2,700 (see FIG. 1C). Measurements agree with the expected value for this structure's first out-of-plane vibrational mode.

The piezoelectric effect is capable of driving the device with ac signals as low as 5 μV before the onset of intrinsic thermomechanical fluctuations (inset of FIG. 1C), which corresponds to approximately single-electron actuation efficiency. Assuming a maximum current flow of 1 nA at 5 μV ac drive (the actual measured current in the low bias regime was typically between 0.001 and 1 μA per 20 mV, which would lead to an even lower estimate of power consumption) the minimum required power consumption of this device approaches 5 femtowatts, and ~1 nanowatt being more representative of typical operating conditions (ac drive of 10 mV) during actuation, with further improvement expected from semiconductor band structure optimization.

Accordingly, the above device demonstrates the efficiency of the integrated excitation technique in terms of both charge and power. For comparison, magnetomotive and electrothermal NEMS actuation schemes are not easily amenable to comparable power efficiency, because their operation draws current instead of voltage. Moreover, a wide variety of schemes rely on external electromagnetic fields mediated by gates (electrostatic), solenoids (magnetomotive) or lasers (optothermal), hence they are not built into the active vibrating structure. These constraints may limit flexibility in creating integrated nanomechanical systems.

The strain generated by an electric field is concentrated within the highly resistive charge depletion region. This allows the adjustment of the piezoelectric actuation efficiency by altering the depletion width with an applied voltage, much in the same way as capacitance is systematically altered in varactors. This effect is unique to nanoscale semiconductor structures, whose characteristic length scale (i.e., the thickness of the pin heterostructure) is comparable to the depletion width.

Figure 2A:
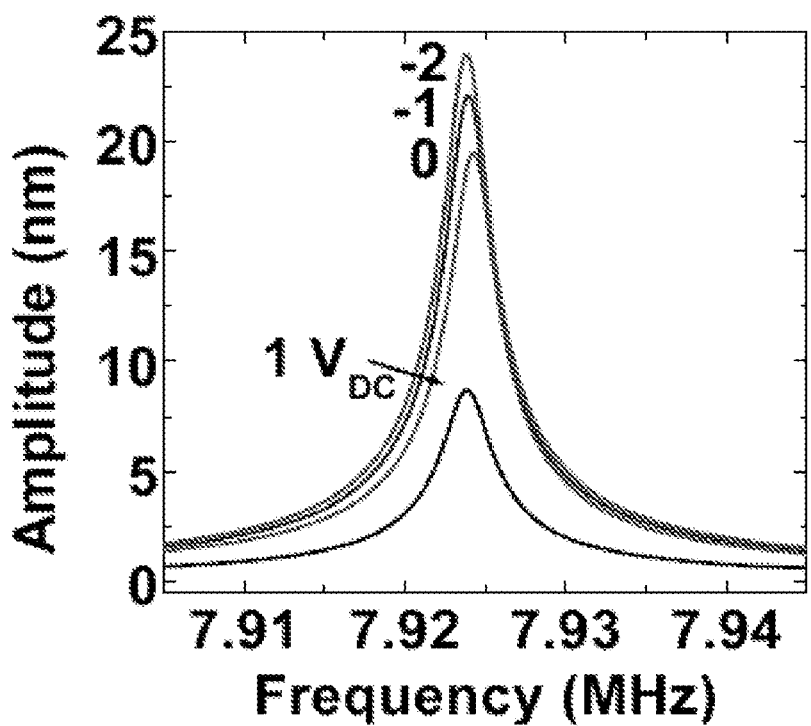
FIG. 2 illustrates voltage tunable, depletion-mediated strain that manifests itself as a change in actuation efficiency in accordance with one or more embodiments of the invention.
Figure 2B:
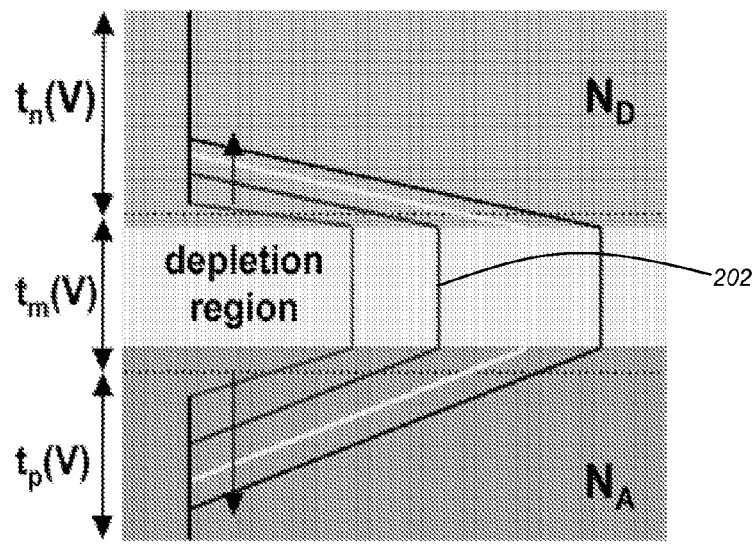
Figure 2C:
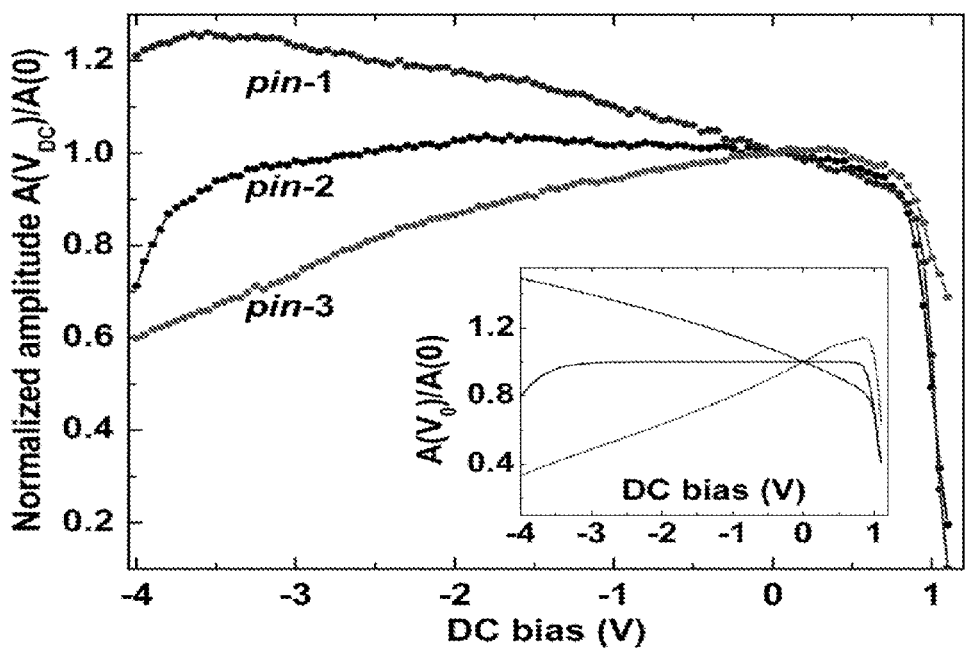

To verify this form of electromechanical coupling, the performance of the cantilever is measured in accordance with FIG. 2. In this regard, FIG. 2 illustrates voltage tunable, depletion-mediated strain that manifests itself as a change in actuation efficiency. FIG. 2A illustrates a frequency response of the same device as FIG. 1 but with fixed ac drive (10 mV) and different dc bias. FIG. 2B illustrates a model electric field distribution in a stereotypical pin junction. The different lines correspond to the field under increasing applied voltage. The field lines are skewed toward the lower doped side (in this case, the p-type layer 202), resulting in a different piezoelectric strain distribution that alters the actuation efficiency. FIG. 2C illustrates normalized resonance amplitude versus dc bias voltage for three different pin diodes embedded in identically shaped cantilevers. For ease of comparison the response of each device is normalized to its own amplitude at zero dc volts. The ac driving signal is fixed at 10 mV. The inset shows the predicted behavior.

In view of the above, FIG. 2A illustrates the measured performance of the cantilever under different dc bias conditions. As expected, the mechanical amplitude of the device's response is found to depend on dc voltage. A simple analytical model may be developed that combines two competing mechanisms that control actuation: depletion-mediated strain (FIGS. 2B and 5 [see below]), and variable resistance of the pin diode junction (FIG. 6 discussed in detail below). Because strain is proportional to the voltage across the junction, a lowering of resistance via excessive forward or reverse biasing of the diode leads to a reduction of actuation efficiency. However, this effect is not evident as long as the diode bias value lies below its "on" state and above breakdown, which is respectively determined to be at 0.7 and −3 V.

To validate predictions, identical cantilevers may be fabricated from three pin diode junctions, and their resonance amplitude measured as a function of dc voltage. The diodes' doping profiles are designed to demonstrate three qualitatively different effects of depletion-mediated strain on actuation: increasing resonance amplitude under decreasing voltage (pin-1), constant amplitude (pin-2), and decreasing amplitude (pin-3). Good agreement can be found between the observed and predicted mechanical response of these devices (see FIG. 2C).

Figure 3A:
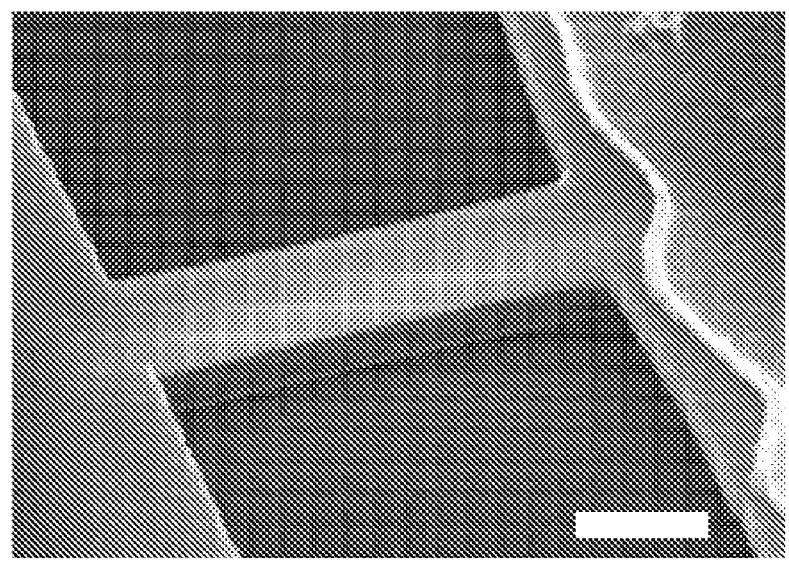
FIG. 3 illustrates piezoelectric resonance frequency control in accordance with one or more embodiments of the invention.

Another feature of NEMS crafted from piezoelectric materials is voltage-induced resonance frequency control. To demonstrate such voltage-induced resonance frequency control, doubly clamped beams may be fabricated as shown in FIG. 3A. These structures are driven to resonance in the same fashion as cantilevers. Shifts in resonance are clearly observed upon dc-biasing the device (FIG. 3B), because piezoelectric strain is converted into stress as a result of clamped-clamped boundary conditions [15]. In the case of small perturbations, this behavior can be quantitatively described by the following expression [16]:

$$\Delta f = \sqrt{3Y/\rho} d_{3j} V/(2\pi t^2) \tag{1}$$

The elastic Young's modulus Y is 101 GPa, the density $\rho$ is equal to 5.3 g/cm$^3$, and t is the total device thickness (i.e., 200 nm). The above expression implies linear frequency-voltage dependence. In addition, due to the anisotropic nature of the piezoelectric coefficient, one may expect to be able to control the slope of $\Delta f$ by fabricating the beam along a prescribed direction. Both predictions are verified by the measurements displayed in FIG. 3C. The equal and opposite tuning slope of devices aligned along [110] and [−110] is characteristic of the opposite sign of $d_{3j}$ along these directions. Fitting the slope of the steepest line to Eqn. 1 yields a value of $d_{3j}=-1.33$ pm/V, in excellent agreement with the accepted measured value [13].

Figure 3B:
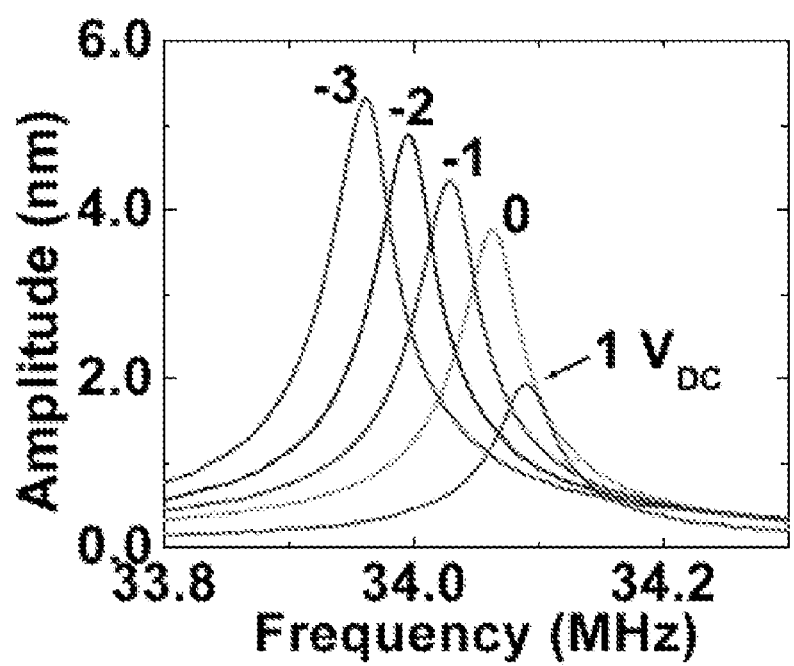

Note that since stresses in cantilevers can relax by expanding or contracting, their frequency tunability is significantly lower than that of beams, as is evident by comparing FIGS. 2A and 3B. The combination of integration, linearity, voltage efficiency and crystallographic anisotropy of piezoelectric frequency tuning presents an advantage over other tuning mechanisms that rely on electrostatic force [5] or thermal stress [17]. Devices that may benefit from the added functionality include parametric amplifiers [18], intrinsically cooled nanomechanical resonators [19], and voltage controlled mechanical oscillators in frequency standards or sensing applications.

Figure 3C:
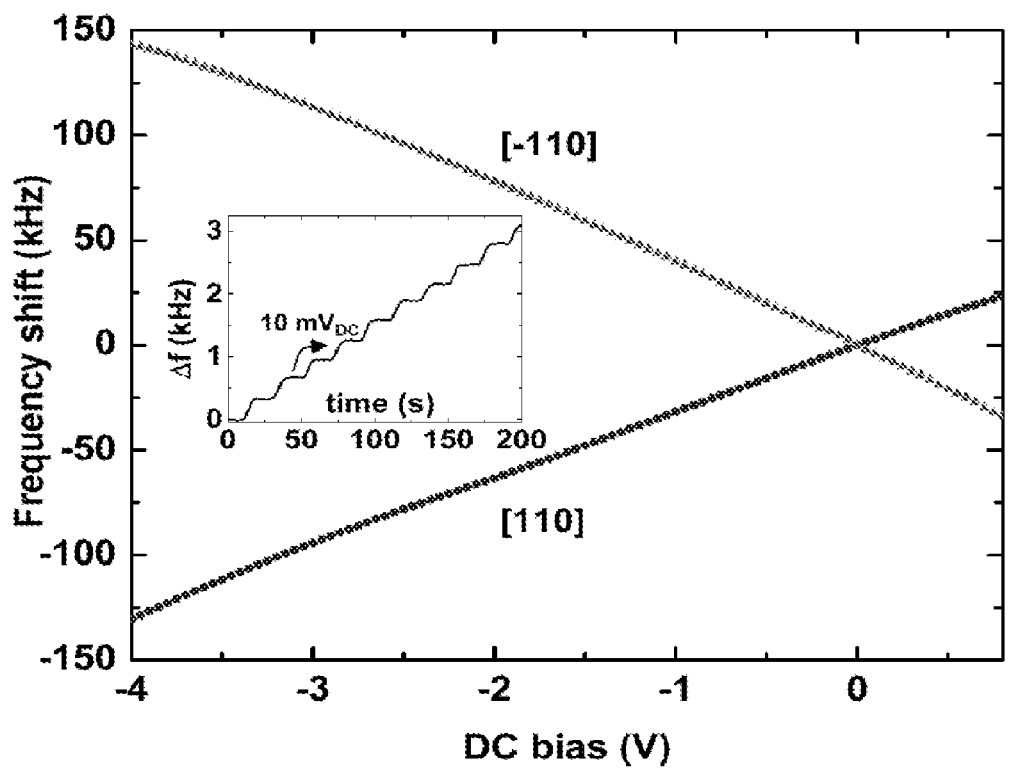

As a further example of the potential application of voltage-dependent frequency tuning, one can demonstrate piezoelectric nanomechanical charge sensing. The inset of FIG. 3C shows the time progression of frequency during stepwise 10 mV increases in DC bias. Each step corresponds to the addition of about 2 kV/cm field across the depletion region or ~500 electronic charges on the resonant device. It is important to distinguish the total induced charge, which is dominated by the parasitic capacitance of the gold wire bond contact pads (and is much greater than 500 e$^-$ per 10 mV bias), from the charge on the NEMS device. Further, the phase-locked loop sampling rate was set to 10 Hz.

The highest achievable resolution at room temperature is ~100 electrons, and it may be possible to approach single-electron resolution by utilizing enhanced readout techniques, optimized quality factor, and higher aspect ratio beams. In this regard, one would ideally like to make devices as thin as possible in order to maximize charge sensitivity (see Eqn. 1). However, surface depletion effects in GaAs place practical constraints on this dimension. In view of the above, it may be noted that unlike other NEMS resonator sensors, which typically only measure mass accretion, tunable piezoelectric transducers could also serve as detectors of ionic species, making them attractive candidates for mass spectrometry applications [3].

Accordingly, as described above, FIG. 3 illustrates piezoelectric resonance frequency control. FIG. 3A illustrates a doubly clamped beam structure with dimensions: L, w, t=4, 0.8, 0.2 μm. Scale bar: 1 μm. FIG. 3B illustrates a frequency response near the beam's fundamental out of plane resonance mode. Each line corresponds to a different dc bias applied across the diode junction. The ac driving amplitude is fixed at 70 mV. FIG. 3C illustrates phase-locked loop measurements of resonance frequency shift as a function of voltage. The different lines correspond to beams fabricated along the [110] and [−110] crystallographic directions, respectively. The slopes of the lines have opposite signs because of piezoelectric anisotropy. The inset shows the time-dependent frequency shift under stepwise addition of 10 mV. About 500 electronic charges are added to the beam at each step.

One's ability to finely control the mechanical response of NEMS devices in a variety of ways raises the intriguing possibility of realizing elements for nanomechanical logic and computation. One may note that some of the earliest computers were mechanical, and interest in this concept has resurfaced with the advent of nonvolatile carbon nanotube memory elements [22]. As an initial implementation of piezoelectric NEMS logic, embodiments of the invention take advantage of the crystallographic anisotropy of $d_{3j}$.

Figure 4A:
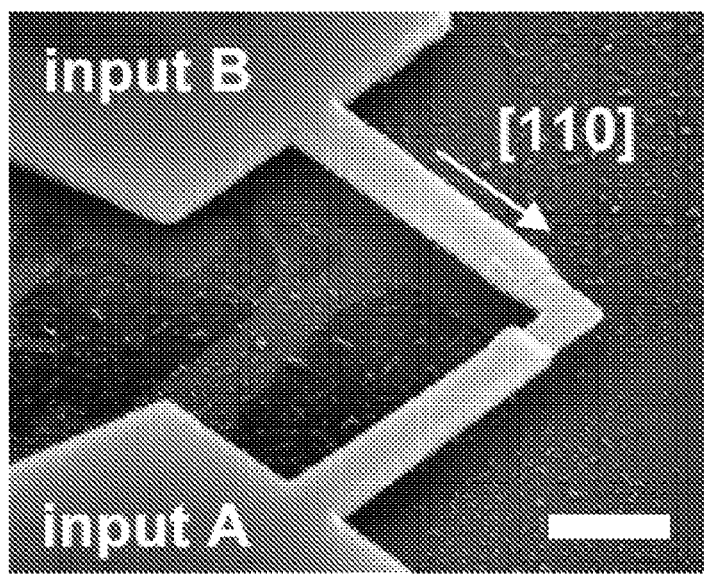
FIGS. 4A-C illustrate radio frequency nanoelectromechanical analog of a XOR logic gate in accordance with one or more embodiments of the invention.

The prototype device, pictured in FIG. 4A, consists of an L-shaped cantilever with two separately addressable inputs for actuation. The top conducting portion of the structure has been removed at the tip, resulting in a pair of mechanically bound but electrically isolated actuators. By driving from only input A or B, the entire structure resonates with a fundamental frequency of 10 MHz and Q of 2,000 (FIG. 4B).

Figure 4B:
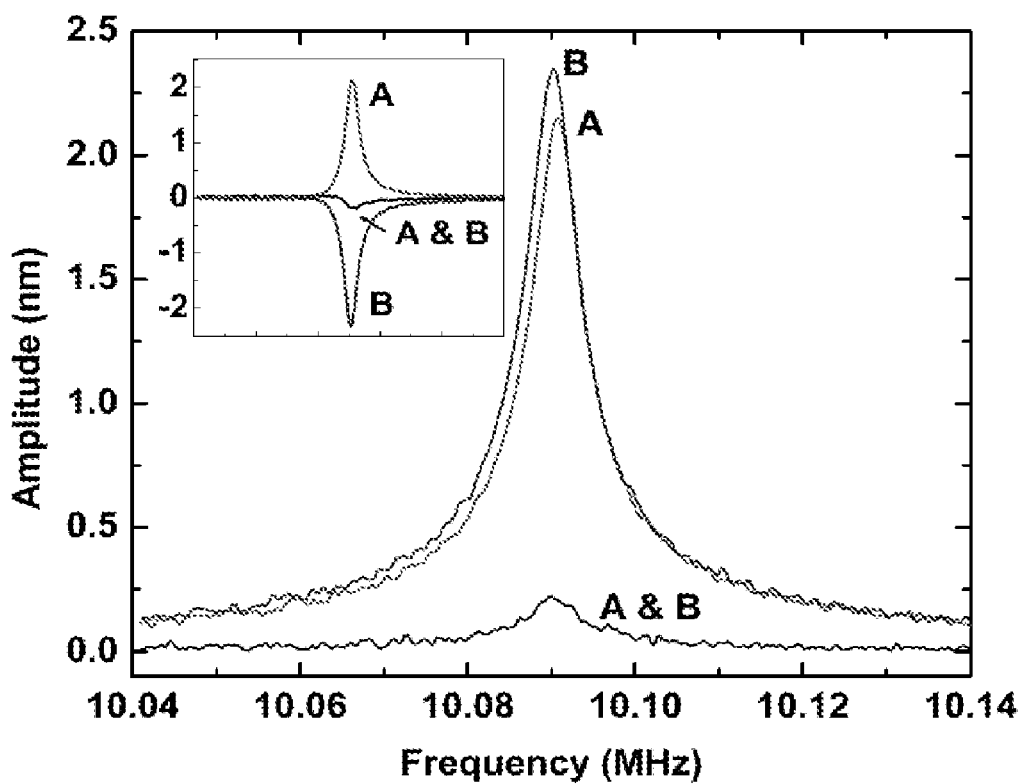
Figure 4C:
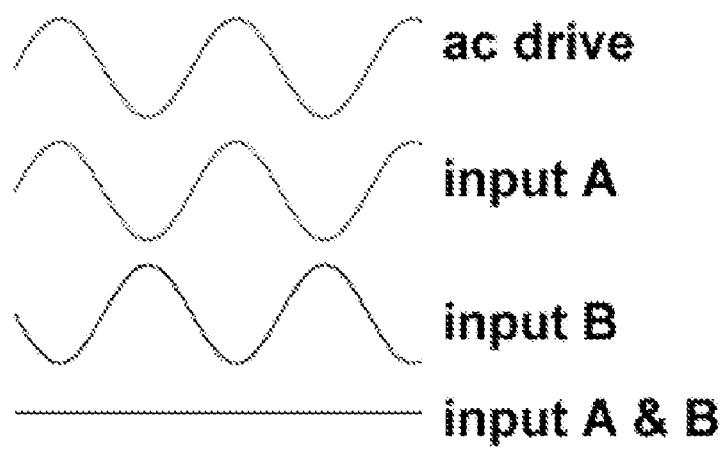

Since the two halves of the structure are aligned along crystallographically orthogonal directions, one may observe that a stimulus at input A results in an equal-in magnitude but opposite-in phase mechanical response than the same stimulus applied at input B (see inset of FIG. 4B, and FIG. 4C). The small disparity between the response to a drive at input A and response to input B is believed to be due to symmetry-breaking device inhomogeneities introduced during fabrication.

Thus when the same magnitude driving stimulus is applied to both inputs simultaneously via a zero degree power splitter, the response of the device is found to be significantly attenuated, as one would expect from a cancellation of motion. This device represents a prototype radio frequency nanomechanical analog to an exclusive-or (XOR) logic gate with a demonstrated on/off ratio of 8:1. One may envision integration of NEMS logic in large scale arrays that could carry out preliminary computations in the electromechanical domain prior to conventional digital processing [24]. Potential advantages of this approach include lower net power consumption, and greater functionality in computation.

Thus, FIG. 4 illustrates radio frequency nanoelectromechanical analog of a XOR logic gate. FIG. 4A illustrates an L-shaped cantilever with electrically isolated but mechanically connected inputs. Scale bar: 1 μm. FIG. 4B illustrates the measured frequency response to a 5 mV ac driving signal applied to the inputs. The inset shows the real component of the response signal, indicating the 180 phase shift between the response due to driving at input A and the response due to driving at input B. FIG. 4C shows a schematic illustration of the mechanical XOR logic gate's operational principle, exploiting piezoelectric anisotropy. When an ac drive is applied across only one of the inputs, the device responds with equal mechanical amplitude but opposite phase (the "on" state). This results in an effective cancellation of motion ("off" state) when the drive is simultaneously applied to the two inputs.

npn Junction Embodiment

To demonstrate the generality of one or more embodiments of the invention (e.g., of an actuation scheme) to other semiconductor structures, identical cantilevers may be fabricated out of a GaAs npn bipolar transistor. From top to bottom, the doping profile is: 100 nm n-GaAs ($10^{19}$ cm$^{-3}$)/50 nm p-GaAs ($2\times10^{18}$ cm$^{-3}$) / 50 nm n-GaAs ($2\times10^{18}$ cm$^{-3}$)/550 nm n-Al$_{0.8}$Ga$_{0.2}$As/n$^+$-GaAs substrate.

FIG. 4D shows the measured mechanical properties of these devices. It may be found that GaAs bipolar transistors can be actuated with a comparable efficiency to pin diodes. Thus bandstructure engineering of piezoelectric semiconductor NEMS appears to be a robust technique that enables actuation of devices without any as-grown insulating layers, which is impossible to do with most other materials. The actuation model for bipolar transistors may involve five bias-dependent layers, two of which are piezoelectric. One may qualitatively understand the observed bias dependence of the resonance amplitude by treating the transistor as two pn diodes sandwiched back-to-back. A negative voltage corresponds to a downward electric field vector, so most of the potential drop will occur at the upper pn junction. This places the piezoelectric strain closer to the neutral axis, so the bending moment, hence resonance amplitude, should decrease. Conversely, a positive voltage will bias the lowermost pn junction, shifting strain away from the neutral axis, so the bending moment should increase.

Accordingly, FIG. 4D illustrates a resonant response of an npn GaAs cantilever under different ac driving voltages and fixed dc bias. The quality factor of this device is 700. FIG. 4E illustrates a resonant response of the same device under fixed ac and varying dc bias. FIG. 4F illustrates a resonance amplitude vs. dc bias, with an ac drive of 10 mV$_{RMS}$. For clarity, results are normalized to the zero bias amplitude. The inset of FIG. 4F shows the corresponding signal attenuation at 8 MHz.

Detailed Description of Materials and Methods

The proceeding description sets forth a detailed description of materials and methods that may be used with various specific embodiments of the invention.

A. Epitaxial PIN Diode Structures

The material is grown on a p$^+$ $^{GaAs}$ (001) substrate using molecular beam epitaxy. A sacrificial layer of 550 nm of p-Al$_{0.8}$Ga$_{0.2}$As ($10^{18}$ cm$^{-3}$) is deposited, followed by the 200 nm p-type/intrinsic/n-type (pin) heterostructure with the p-type layer on the bottom. Three separate wafers are grown with the following thickness and doping specifications (doping in cm$^{-3}$). Diode pin-1: 100 nm n-GaAs ($10^{19}$)/50 nm i-GaAs/50 nm p-GaAs ($10^{18}$); pin-2: 100 nm n-GaAs ($10^{19}$)/ 50 nm i-GaAs/50 nm p-GaAs ($10^{19}$); pin-3: 50 nm n-GaAs ($10^{19}$)/50 nm i-GaAs/100 nm p-GaAs ($10^{18}$). Note that the intrinsic layers referred to as i-GaAs have a p-type background concentration of ~$5\times10^{15}$ cm$^{-3}$, however, this is negligible compared to the intentionally doped n and p-type regions.

B. NEMS Device Fabrication

For the top electrical contact, $150\times150$ μm$^2$ electrodes are defined photolithographically and deposited with a thin Ti adhesion layer followed by 50 nm of Au. Low contact resistance is obtained without annealing. The large electrode area may be necessary for wedge-type wirebonding of Au contact wires. For the bottom contact the back side of the p$^+$ wafer is covered with Ti/Au. Electron-beam lithography is used to define a NEMS device adjacent to the top electrode. A 70 nm Ti etching mask is evaporated in the developed pattern, and is followed by a low energy Ar ion milling step to remove the unmasked pin layer. Finally, the preferential etching of Al$_{0.8}$Ga$_{0.2}$As to GaAs by dilute hydrofluoric acid allows the devices to be released from the substrate, and HF simultaneously removes any remaining Ti masking material. Electrical connection to the bottom contact is maintained through unetched, highly doped AlGaAs underneath the large electrodes. The cantilevers and doubly clamped beam (FIGS. 1 and 3, respectively) both have dimensions (L, w, t)=(4, 0.8, 0.2) μm. The 0.8 μm width was chosen to provide a large reflected optical signal. The doubly clamped beam is fabricated from the pin-1 heterostructure. The L-shaped structure (FIG. 4, constructed from the pin-1 heterostructure) has two arms that are 3.8 μm long and 0.5 μm wide. Prior to selectively removing the AlGaAs in that device, the top 130 nm was removed by ion milling from the corner where the arms meet, leaving two electrically isolated but mechanically connected terminals.

C. Optical Measurement

Samples are mounted in a room temperature vacuum (P=5 mTorr) chamber fitted with a sapphire optical window. The bottom electrode is grounded. In order to minimize the impact of light on device performance (heating, photocarrier generation) a 2 mW, 904 nm infrared laser diode is used with a 10-fold extinction factor neutral density filter. The beam is focused to a spot of 10-20 μm diameter. A low noise, high bandwidth photoreceiver is used for detection. Optical signals are converted into displacement by one of the following three methods:

(i) The resonance amplitudes of the cantilever in FIGS. 1C and 2A are calibrated to the thermomechanical noise amplitude at room temperature, which can be calculated using the expressions in [S1]. However, thermomechanical noise measurements are not available for the stiffer devices shown in FIGS. 3 and 4.

(ii) The doubly-clamped beam in FIG. 3A is calibrated by measuring the onset of nonlinear mechanical bistability, which was found to occur at a drive of 330 mV for the 4 μm-long doubly-clamped beam with the Q of 700. This value (330 mV) is then normalized with respect to the critical amplitude $z_{crit} \approx t\sqrt{4.19/Q}$, which is derived from Ref. S2.

(iii) The amplitude of the L-shaped cantilever in FIG. 4A is estimated from the model of piezoelectric actuation that is discussed below. Note: all ac driving voltages refer to root-mean-square (rms) values.

Approximate Expressions

In this section, approximate expressions are obtained for the tunable piezoelectric actuation of a cantilever responsible for the effects observed in FIG. 2.

A. Mechanism 1—Depletion-Mediated Strain:

The static, out of plane deflection of a trimorph cantilever is [S3]:

$$z(V)=(3L^2 d_{3j} V/t^4_{tot})\{t_n(V)[t_n(V)+t_m(V)]-t_p(V)[t_p(V)+t_m(V)]\} \quad (S1)$$

where L is the cantilever's length, $d_{3j}$ is the piezoelectric constant, V is voltage and $t_{tot}$=200 nm. The bias-dependent n, p and middle (i.e., intrinsic) layer thickness are denoted by $t_n(V)$, $t_p(V)$ and $t_m(V)$ respectively. Piezoelectric strain originates within $t_m(V)$. In the abrupt junction approximation the depletion width of a pin diode is $$d(V)=\sqrt{t^2_{m,0}+2\in N_{tot}(V_{bi}-V/eN_A N_D)} \quad (S2)$$

where $t_{m,0}$ is the as-grown intrinsic layer thickness, $N_A$ and $N_D$ is the respective p and n layer doping concentration, and $\in$ is the dielectric constant. The doping impurities are assumed to be fully ionized at room temperature. This model breaks down in the vicinity of the built-in potential $V_{bi}$~1.2 volts, and the analysis herein is restricted to below this value. The electric field distribution in the pin junction drops linearly from a maximum at the intrinsic layer to zero at the edges of the charge depletion region. Most of the electric field, hence most of the piezoelectric strain, is concentrated within the half-maximum points, yielding the following approximation for layer thicknesses:

$$t_p(V) = t_{p,0} - 0.5 N_D [d(V) - t_{m,0}]/N_{tot}$$

$$t_m(V) = t_{m,0} + 0.5 d(V)$$

$$t_n(V) = t_{n,0} - 0.5 N_A [d(V) - t_{m,0}]/N_{tot} \quad \text{(S3A, B, C)}$$

The resonant motion is effectively amplified by the quality factor Q, such that the resonance amplitude is given by $$A(V_{DC}, v_{AC}) = 0.5 Q |z(V_{DC} + v_{AC}) - z(V_{DC} - v_{AC})| \quad \text{(S4)}$$

Figure 5A:
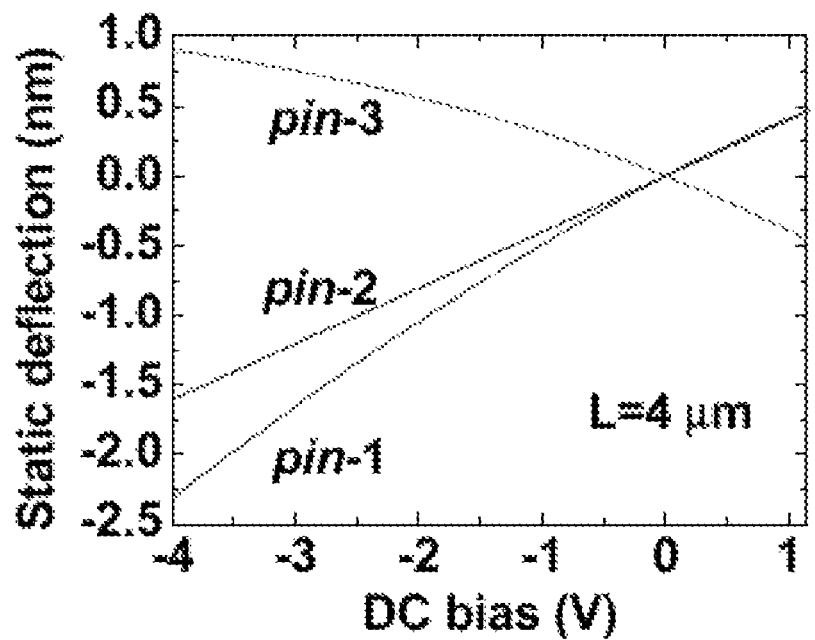
FIG. 5 illustrates the effect of depletion-mediated strain on the actuation of a piezoelectric NEMS resonator in accordance with one or more embodiments of the invention.
Figure 5B:
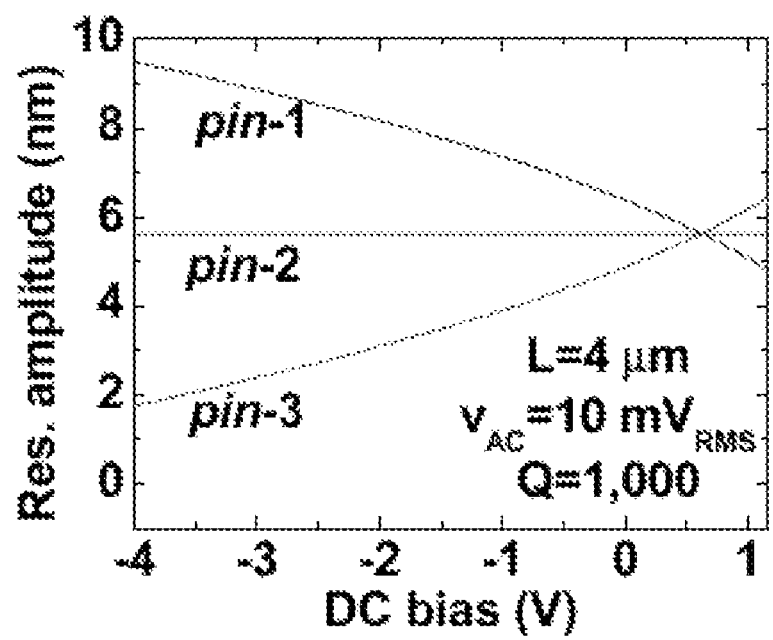

Equations S1 and S4 are plotted as a function of voltage in FIG. 5. In this regard, FIG. 5 illustrates the effect of depletion-mediated strain on the actuation of a piezoelectric NEMS resonator. FIG. 5A illustrates a plot of Eqn. S1; static deflection given a 4 μm-long cantilever. FIG. 5B illustrates a plot of Eqn. S4; resonance amplitude of a 4 μm cantilever assuming a Q=1,000 and drive of 10 mV$_{RMS}$.

B. Mechanism 2—Variable Impedance of PIN Junction:

The diode's resistance $R_d$ and junction capacitance $C_j$ will depend on applied voltage, so under large bias/high frequency conditions a sizeable fraction of the radio frequency driving signal $v_{AC}$ will be attenuated. The model for signal attenuation effects is based on the equivalent circuit of diode-embedded resonators, depicted in FIG. 6A. A pin diode can be treated as a variable resistance and junction capacitance in parallel, and in series with the resistance of the contacts and intrinsic layer. The motional LCR components are found to have a negligible impact on electrical properties and are henceforth ignored. The entire circuit is in series with a contact electrode and other external impedances denoted by $R_0$, which are on the order of 50Ω. As long as the total diode impedance greatly exceeds $R_0$, most of the driving voltage will contribute toward piezoelectric actuation. The actuation efficiency as a function of dc bias is given by $$v_{AC}/v_{AC,0} \approx R_d / \sqrt{(R_0 + R_d)^2 + (\omega R_0 R_d C_j)^2} \quad \text{(S5)}$$

The diode resistance and capacitance are respectively given by $R_d(V) = dV/dI$ and $C_j(V) = \epsilon A/d(V)$, where A is the contact electrode plus mechanical device area, and equal to 150×150 μm² in this set of devices. The I(V) curves of the three pin diodes are displayed in FIG. 6B. The corresponding ac driving efficiencies calculated from Eqn. S5 are plotted in FIG. 6C. The model shown in the inset of FIG. 2C is obtained by multiplying the curves in FIGS. 5B and 6C, and normalizing the amplitudes with respect to their zero dc bias value.

Figure 6A:
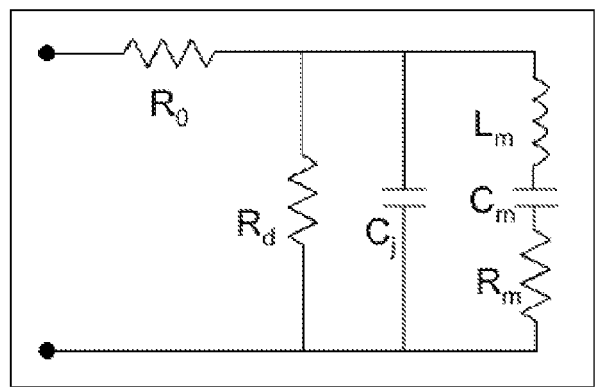
FIG. 6 illustrates a model for signal attenuation effects and corresponding resulting curves in accordance with one or more embodiments of the invention.
Figure 6B:
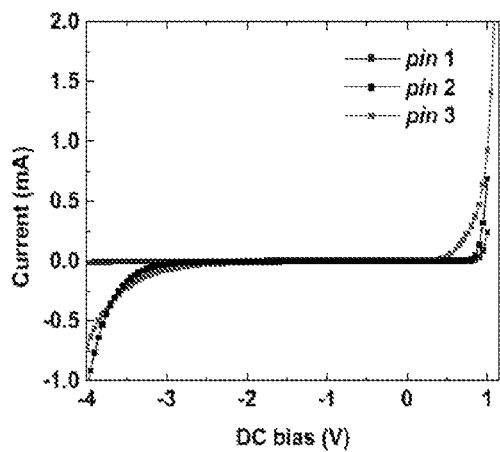
Figure 6C:
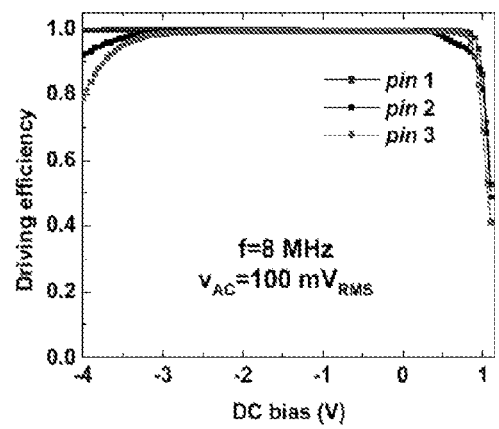

Thus, in view of the above, FIG. 6A illustrates an equivalent circuit of a mechanical pin diode resonator in accordance with one or more embodiments of the invention. $R_0$, $R_d(V)$, $C_j(V)$ are the contact resistance, diode resistance and junction capacitance, respectively. The estimated motional circuit components have ~100 times higher impedance than other components, and can thus be neglected in the analysis. FIG. 6B illustrates measured I(V) curves of the three pin diodes and FIG. 6C illustrates the calculated driving efficiency of a 8 MHz signal using Eqn. S5. The efficiency from −3 to 0.7 V is very close to 100% for all three diodes.

Nanomechanical Mode-Shape Engineering

Mode-shape engineering may be used to exploit the crystallographic anisotropy of piezoelectricity because it should be possible to control which resonance modes to excite. The basic concept is demonstrated with the 8 μm wide cross-beam structure shown in FIG. 7. The first few modes of this device without including any piezoelectric effects were obtained from finite element simulations and are illustrated as insets on the left side of FIG. 7. For comparison, the right side of the figure shows the corresponding mode for a simple doubly clamped beam of the same length. The fundamental mode involves the entire structure moving vertically in phase, but piezoelectric anisotropy should strongly oppose this mode from being exciting. Besides actuating this device via the internal piezoelectric effect, the device was also shaken using a PZT crystal mounted underneath the GaAs chip. Since the capacitance of the PZT crystal is similar to that across the pin junction, the driving efficiency of the two schemes can be directly compared. It was found that in contrast to all other observed modes, the first cross-beam could be actuated with comparable efficiency by internal and external means. This suggests the fundamental mode is indeed suppressed during internal piezoelectric excitation.

Figure 7:
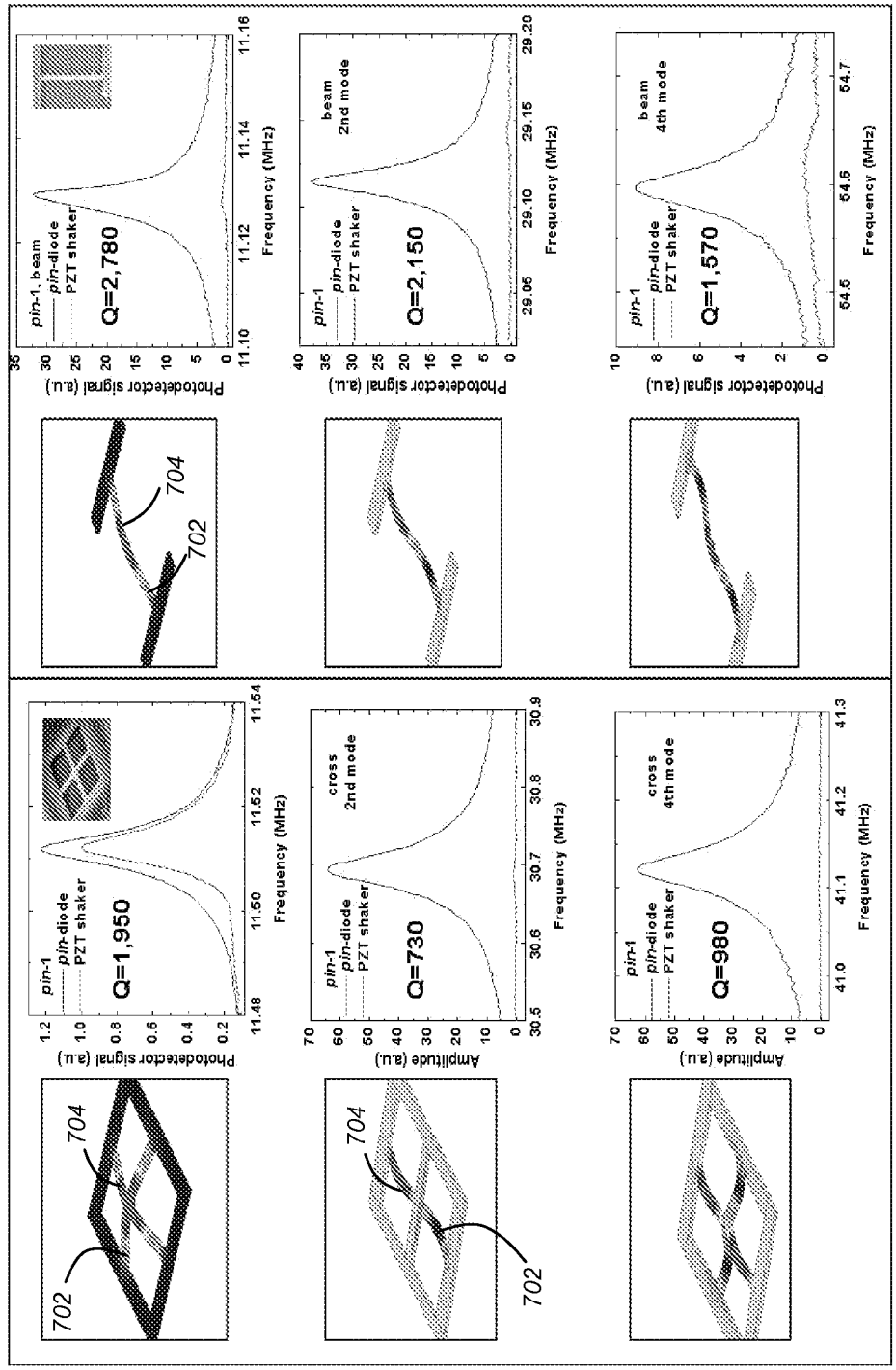
FIG. 7 illustrates mode shape engineering structures in accordance with one or more embodiments of the invention.

Accordingly, in view of the above, FIG. 7 demonstrates mode suppression in a cross-beam resonator fabricated from diode pin-1. The renderings are from finite-element simulations of the 1st, 2nd and 4th mode shapes. Resonance curves represent the response to an internal piezoelectric 702 or external PZT shaking 704 actuation mechanism. The left set of data are from the 8 μm cross-beam and the right set from a simple beam of the same length. Due to piezo-crystalline anisotropy, the first cross-beam mode should be suppressed by internal excitation. The actuation of the 1st cross-beam mode is excited nearly as efficiently by the PZT shaker as by internal means (top left). In contrast, internal excitation of the 1st beam mode is 30 times more efficient than by external means (top right). A comparison of the top left and right curves suggests that the 1st cross mode is suppressed by a factor of ~30.

Improvements in device symmetry could lead to even stronger mode-shape suppression. In contrast to the 1st mode, the 2nd, 3rd (not shown but similar to 2nd) and 4th cross modes are excited ~70 times more efficiently by internal piezoelectric means rather than by shaking This further suggests that the internal piezoelectric actuation mechanisms can efficiently access higher order modes that are otherwise challenging to activate. Also note that the quality factor of higher order modes usually decreases more slowly than the corresponding increase in frequency, suggesting that higher order modes may be well suited to mass sensing applications. Mode suppression represents a unique level of control that does not appear possible with other actuation mechanisms.

Figure 8:
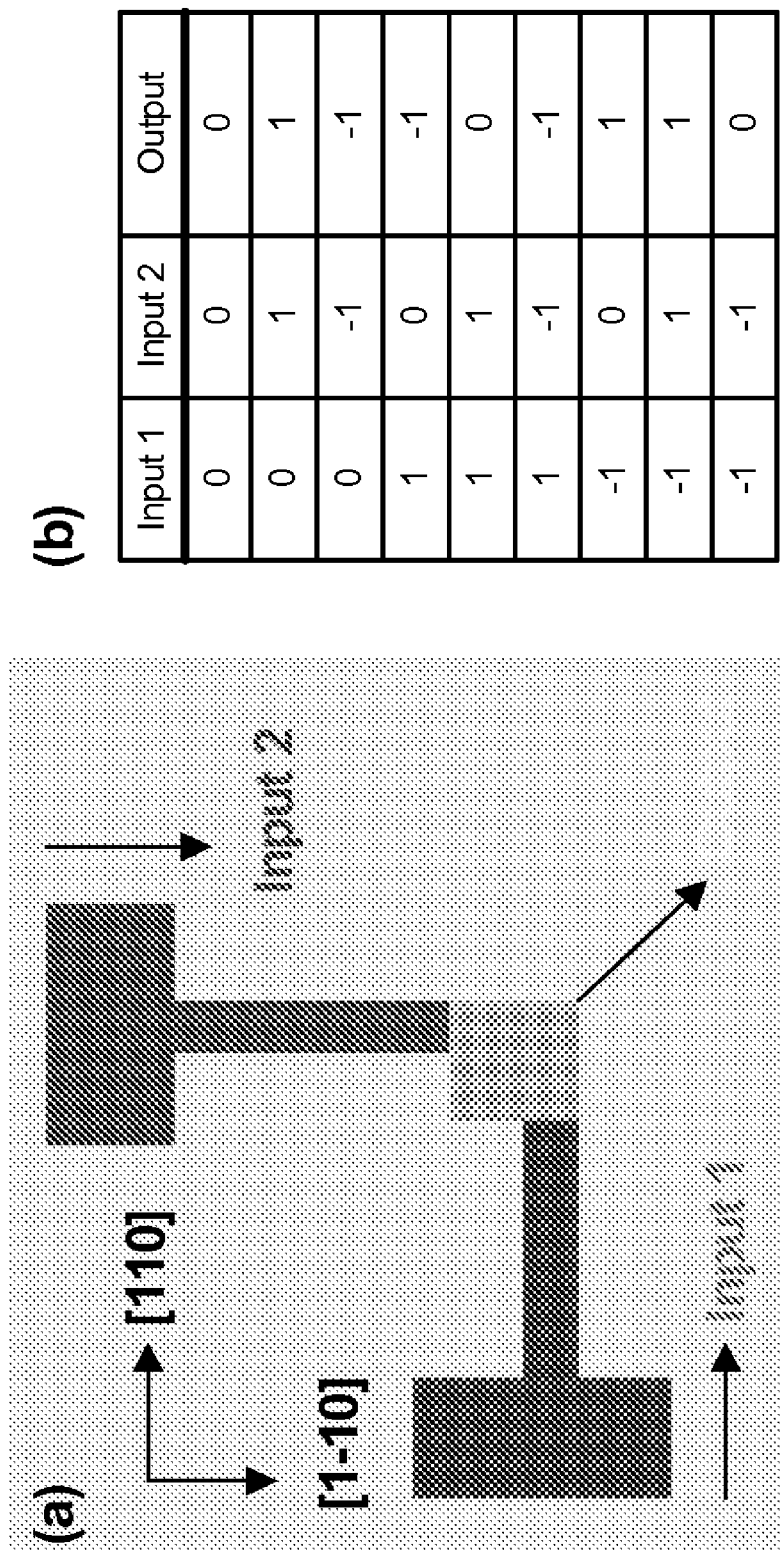
FIG. 8 illustrates potential piezoelectric NEMS devices operating as logic gates in accordance with one or more embodiments of the invention.

Additional embodiments could potentially include nanoelectromechanical logic devices. FIG. 8 illustrates how such a piezoelectric NEMS devices might operate as logic gates, together with a predicted truth table in accordance with one or more embodiments of the invention. If two identical signals are applied to the inputs, the output shown may remain stationary and register as a "0". But if a signal is applied to only one input, the output will move and register as "1" or "−1" depending on the phase relationship. Note that, owing to piezoelectric anisotropy, there are three possible input and output states, where we have assigned 0° phase a value of "1" and 180° phase a value of "−1". Alternatively, one may view "1" as up, "−1" as down and "0" as flat. A practical application that may exploit this technology could include differential mechanical amplifiers, which may improve NEMS sensor performance.

In view of the above, FIG. 8a is a schematic illustration of the nanomechanical logic gate concept employing the piezoelectric anisotropy property of GaAs and other crystals. FIG. 8b is an expected truth table for such a device. Zeros correspond to no signal; 1's are symmetric oscillations and −1's are antisymmetric. If the input signals are both 0 or ±1, then the output will not register any motion.

Logical Flow

FIG. 9 illustrates the logical flow for utilizing/actuating/activating a nanoelectromechanical system (NEMS) device/resonator in accordance with one or more embodiments of the invention.

At step 900, the NEMS device is fabricated. Such a device may consist of/comprise a movable/resonant member that includes a region of low conductivity over which an electric field is developed. The width of the region (referred to as region width) is within a factor of ten (10) of a thickness of the NEMS device. Such a region of low conductivity may be a depletion layer. In addition, the region may be formed between a junction that incorporates piezoelectric material. In one or more embodiments, such a junction may be formed by differently doped semiconductors. For example, the junction may be a PIN diode, a p-type/n-type junction, a p-n-p type junction, or a n-p-n type junction.

Further to the above, in one or more specific embodiments, the device may be a resonator that consists of a semiconductor p-type/intrinsic/n-type (PIN) diode, wherein the region is a charge depleted high resistance region or depletion region in a middle of the PIN diode that forms a piezoelectrically active layer. Further, the semiconductor PIN diode may be epitaxially grown as a GaAs. Alternatively, any other suitable piezoelectric semiconductors may be used. Alternatives may include but are not limited to AlN (Aluminim nitride), SiC (Silicon Carbide), or ZnO (Zinc Oxide).

As described above, the movable member of the device may be a cantilever. Such a cantilever can be an L-shaped cantilever with two separately addressable inputs for actuation. Two halves of the L-shaped cantilever can be aligned along crystallographically orthogonal directions. In such an embodiment, the device comprises a radio frequency nanomechanical analog to an exclusive-or (XOR) logic gate.

Alternatively, in one or more embodiments, the movable member may be doubly clamped beams. In such an embodiment, the device may be used to detect charge species (e.g., in a mass spectrometry application).

At steps 902 and 904, the device is tuned and activated. At step 902, a first voltage (e.g., an DC voltage) is applied across the region formed between the junction that incorporates the piezoelectric material. The application of the first voltage alters a width of an active portion (i.e., a piezoelectrically active portion of the region) thereby adjusting a movement of the movable member that can be induced by a second voltage. In one or more embodiments the first voltage may be a DC voltage that is applied across a PIN diode thereby alter a width of the depletion region which adjusts an amount of the AC signal necessary to actuate the resonant member. In an alternative embodiment, both the first and second voltages may be the same voltage.

At step 904, a second voltage (e.g., an AC signal) is applied across the region to produce a strain on the active portion of the region. The strain results in a defined movement (i.e., a movement of a particular defined amount) of the movable member. In a PIN diode resonator embodiment, the second voltage may be an AC signal is that applied across a PIN diode to produce a strain on the piezoelectrically active layer, wherein said strain results in an actuation or mechanical resonance of a resonant member at or near its resonance frequency.

The order in which the application of the first and second voltage (steps 902 and 904) (also referred to as tuning and actuating/activating) is performed are not important for purposes of the invention and steps 902 and 904 can be interchanged.

Steps 902 and 904 may also include the ability to control the resonance frequency of the resonator member using the DC voltage.

CONCLUSION

This concludes the description of the preferred embodiment of the invention.

The following describes some alternative embodiments for accomplishing the present invention.

The above description demonstrates an approach to designing nanoelectromechanical systems from piezoelectric semiconductors, with tailored band structure, geometry, and crystallographic direction. The resulting electromechanical coupling phenomena, which rely entirely on intrinsic material properties, facilitate the creation of compact, tunable NEMS arrays for multidimensional sensing [25] and nanomechanical computing applications [24]. The ability to regulate actuation efficiency via depletion-mediated strain, in the semiconductor heterostructure's low operating power regime, raises the prospect for developing efficient, high speed electromechanical switches. Such devices may play an important role in selectively addressing individual elements in large scale arrays of NEMS. Furthermore, the integration of a reliable and customizable frequency tuning method adds a useful layer of functionality that has so far been absent in NEMS.

Although not expressly set forth herein, embodiments of the invention may provide for the reversibility of piezoelectric phenomena which offers the potential for ultrasensitive electrical measurement of nanomechanical motion [26-29]. Finally, all of the concepts presented here are transferrable to a wide variety of other materials besides GaAs (e.g., AlN, SiC, or ZnO) that may possess superior electrical and mechanical properties.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[1] H. G. Craighead, *Science* 290, 1532 (2000).

[2] J. Fritz et al., *Science* 288, 316 (2000).

[3] Y. T. Yang, C. Calegari, X. L. Feng, K. L. Ekinci, M. L. Roukes, *Nano Lett.* 6, 583 (2006).

[4] M. D. LaHaye, O. Buu, B. Camarota, K. C. Schwab, *Science* 304, 74 (2004).

[5] A. N. Cleland, M. L. Roukes, *Nature* 392, 160 (1998).

[6] W. C. Fon, K. C. Schwab, J. M. Worlock, M. L. Roukes, *Nano Lett.*, 5, 1968 (2005).

[7] K. L. Ekinci, *Small* 1, 786 (2005).

[8] I. Bargatin, I. Kozinsky, M. L. Roukes, *Appl. Phys. Lett.* 90, 093116 (2007).

[9] P. Curie, J. Curie, *Bulletin de la Société minéralogique de France*, 90-93 (1880).

[12] D. W. Carr, H. G. Craighead, *J. Vac. Sci. Technol. B* 15, 2760 (1997).

[13] K. Fricke, *J. Appl. Phys.* 70, 914 (1991).

[15] B. Piekarski, D. Devoe, M. Dubey, R. Kaul, J. Conrad, *Sens. Actuat. A* 91, 313 (2001).

[16] S. Timoshenko, D. H. Young, W. Weaver, *Vibration problems in engineering* (John Wiley, ed. 4, 1974).

[17] S. C. Jun, X. M. H. Huang, M. Manolidis, C. A. Zorman, M. Mehregany, J. Hone, *Nanotechnology* 17, 1506 (2006).

[18] D. Rugar, P. Grütter, *Phys. Rev. Lett.* 67, 699 (1991).

[19] C. H. Metzger, K. Karrai, *Nature* 432, 1002 (2004).

[22] T. Rueckes, K. Kim, E. Joselevich, G. Y. Tseng, C. L. Cheung, C. M. Lieber, *Science* 289, 94 (2000).

[24] M. L. Roukes, Electron Devices Meeting, 2004. IEDM Technical Digest. IEEE International, pp. 539-542, ISBN: 0-7803-8684-1, INSPEC: 8394455, DOI : 10.1109/IEDM.2004.1419213

[25] M. C. Lonergan, E. J. Severin, B. J. Doleman, S. A. Beaber, R. H. Grubb, N. S. Lewis, *Chem. Mater.* 8, 2298 (1996).

[26] D. Devoe, *Sens. Actuat. A* 88, 263 (2001).

[27] R. G. Beck, M. A. Eriksson, R. M. Westervelt, K. L. Campman, A. C. Gossard, *Appl. Phys. Lett.* 68, 3763 (1996).

[28] Y. Zhang, M. P. Blencowe, *J. Appl. Phys.* 92, 7550 (2002).

[29] R. Knobel, A. N. Cleland, *Appl. Phys. Lett.* 81, 2258 (2002).

[S1] A. N. Cleland, M. L. Roukes, *J. Appl. Phys.* 92, 2758 (2002).

[S2] H. A. Tilmans, M. Elwenspoek, J. H. J. Fluitman, *Sens. Actuat. A* 30, 35 (1992).

[S3] J. Soderkvist, *J. Micromech. Microeng.* 3, 24 (1993).

What is claimed is:

1. A nanoelectromechanical system (NEM) resonator comprising:
    a resonant member comprised of a free-standing mechanical structure including a semiconductor p-type/intrinsic/n-type (PIN) diode, wherein a charge depleted high resistance region or depletion region in a middle of the PIN diode forms a piezoelectrically active layer;
    wherein a DC voltage is applied across the PIN diode to alter a width of the depletion region thereby adjusting an amount of an AC signal necessary to actuate the resonant member; and
    wherein the AC signal is applied across the PIN diode to produce a strain on the piezoelectrically active layer, wherein said strain results in flexural bending moment, wherein said bending moment actuates mechanical resonance of the resonant member at or near its resonance frequency.

2. The resonator of claim 1, wherein:
    the resonant member comprises a cantilever;
    the cantilever comprises an L-shaped cantilever with two separately addressable inputs for actuation;
    two halves of the L-shaped cantilever are aligned along crystallographically orthogonal directions; and
    the resonator comprises a radio frequency nanomechanical analog to an exclusive-or (XOR) logic gate.

3. The resonator of claim 1, wherein the resonant member comprises doubly clamped beams.

4. The resonator of claim 1, wherein the resonance frequency of the resonator member is controlled by the DC voltage.

5. The resonator of claim 1, wherein the device is used to detect charge species.

6. The resonator of claim 1, wherein the free-standing mechanical structure comprises a suspended structure mechanically connected to a substrate at one or more ends of the suspended structure.

7. A nanoelectromechanical systems (NEMS) device comprising:
    a movable member including a region of low conductivity over which an electric field is developed wherein a region thickness of the region of low conductivity is within a factor of ten (10) times smaller than a device thickness of the NEMS device;
    wherein the region is formed between a junction that incorporates piezoelectric material, wherein applying a first voltage across the region alters a width of an active portion of the region thereby adjusting a movement of the movable member induced by a second voltage;
    wherein the second voltage is applied across the region to produce a strain on the active portion of the region, wherein said strain results in a defined movement of the movable member.

8. The device of claim 7, wherein the region of low conductivity is a depletion layer.

9. The device of claim 7, wherein the junction is formed by differently doped semiconductors.

10. The device of claim 7, wherein the junction is a pin diode.

11. The device of claim 7, wherein the junction is a p-type/n-type junction.

12. The device of claim 7, wherein the junction is a p-n-p type junction.

13. The device of claim 7, wherein the junction is a n-p-n type junction.

14. The device of claim 7, wherein the first voltage and the second voltage are the same.

15. The device of claim 7, wherein a mechanical resonant member of the device is made of epitaxially grown Gallium Arsenide.

16. The device of claim 7, wherein the movable member comprises a cantilever.

17. The device of claim 16, wherein:
    the cantilever comprises an L-shaped cantilever with two separately addressable inputs for actuation;
    two halves of the L-shaped cantilever are aligned along crystallographically orthogonal directions; and
    the device comprises a radio frequency nanomechanical analog to an exclusive-or (XOR) logic gate.

18. The device of claim 7, wherein the movable member comprises doubly clamped beams.

* * * * *